United States Patent [19]
Ichikawa et al.

[11] Patent Number: 5,810,028
[45] Date of Patent: Sep. 22, 1998

[54] WASHING APPARATUS FOR DISC-LIKE WORKPIECES

[75] Inventors: Masahiro Ichikawa; Toshikuni Shimizu, both of Ayase, Japan

[73] Assignee: Speedfam Co., Ltd., Tokyo, Japan

[21] Appl. No.: 873,735

[22] Filed: Jun. 12, 1997

[30] Foreign Application Priority Data

Jun. 25, 1996 [JP] Japan .................................. 8-183992

[51] Int. Cl.$^6$ .................................................. B08B 11/02
[52] U.S. Cl. ............................................. 134/66; 134/902
[58] Field of Search ............................... 134/902, 61, 66

[56] References Cited

U.S. PATENT DOCUMENTS

| | | | |
|---|---|---|---|
| 5,177,514 | 1/1993 | Ushijima et al. | 134/902 X |
| 5,254,205 | 10/1993 | Tsutsumi et al. | 134/66 X |
| 5,357,645 | 10/1994 | Onodera | 134/902 X |
| 5,404,894 | 4/1995 | Shiraiwa | 134/66 |
| 5,590,672 | 1/1997 | Ohmori et al. | 134/902 X |

OTHER PUBLICATIONS

Patent Abstracts of Japan, JP3–93040, Apr. 18, 1991.
Patent Abstracts of Japan, JP62–82513, Apr. 16, 1987.

*Primary Examiner*—Philip R. Coe
*Attorney, Agent, or Firm*—Oblon, Spivak, McClelland, Maier & Neustadt, P.C.

[57] ABSTRACT

Numerous spin-dry mechanisms 45A, 45B, and 45C for drying workpieces W at individual drying positions by rotating them at high speed are disposed in a drying section 3 of a washing apparatus, and sequentially move forward and backward between the respective drying position and the workpiece delivery position 3A at which workpieces are delivered to a transfer mechanism 6.

5 Claims, 7 Drawing Sheets

WASHING APPARATUS FOR DISC-LIKE WORKPIECES

FIELD OF THE INVENTION

The present invention relates to a washing apparatus for washing and drying disc-like workpieces such as magnetic or optical disc substrates.

PRIOR ART

Such washing apparatuses have already been made available by Japanese Patent Application Laid Open 5-72011 and Japanese Patent Application Laid Open 3-93040. These washing apparatuses consist of a washing section that uses a brush to wash workpieces and a drying section that uses a spin-dry mechanism to rotate washed workpieces at high speed in order to dry them, wherein unprocessed workpieces are sequentially fed into the washing section where they are washed, then sequentially transferred to the drying section where they are dried, then finally unloaded.

The washing apparatus according to the first invention, however, has only one spin-dry mechanism in the drying section, which means that the workpiece feeding speed is limited by the performance of the spin-dry mechanism, resulting in a low throughput.

The washing apparatus according to the second invention has a high throughput due to the inclusion of numerous spin-dry mechanisms. In this apparatus, however, the spin-dry mechanisms are mounted on an index table at fixed intervals, and the index table is intermittently rotated around the horizontal axis at a specified angle each time until it is moved 360° along the vertical circumference. Thus, liquid adhering to the covers of spin-dry mechanisms located in the upper part of the washing apparatus is likely to fall onto the other spin-dry mechanisms. In addition, since spin drying generally requires more time than washing, the number of spin-dry mechanisms may be reduced compared to the number of workpiece holding means. In such a case, a small number of spin-dry mechanisms are mounted on an index table with a large diameter, which is then rotated 360° along the vertical circumference. This structure does not use space efficiently. Furthermore, since each spin-dry mechanism must be intermittently moved over a long distance, the moving speed must accordingly be increased. As a result, run-out is likely to occur if the mechanism is moved during spin drying, making the required control complicated.

DISCLOSURE OF THE INVENTION

It is a basic object of this invention to solve the conventional problems caused by the use of the index table by providing a configuration that permits efficient movement over a short distance without using the index table to rotate the numerous spin-dry mechanisms in the dry section 360°.

It is another object of this invention to provide a workpiece washing apparatus with an efficient design and structure that permits it to simultaneously wash numerous workpieces.

It is yet another object of this invention to provide a workpiece washing apparatus that can efficiently transfer workpieces, and that can simultaneously supply unwashed workpieces to a washing section, transfer washed workpieces from the washing section to a drying section, and unload dried workpieces from the drying section.

To achieve these objects, this invention provides a washing apparatus in which the workpieces to be processed are continuously fed from a loading section to a washing section, and then to a drying section for sequential washing and drying, eventually being unloaded to an unloading section, characterized in that the drying section has numerous spin-dry mechanisms for drying workpieces at individual drying positions by rotating them at high speed, the mechanisms sequentially moving forward and backward between the respective drying position and the delivery position at which the workpiece is delivered to the transfer mechanism.

According to a specific aspect of this invention, the transfer mechanism consists of a first handler for supplying unwashed workpieces from the loading section to the washing section; a second handler for transferring washed workpieces from the washing section to the drying section; and a third handler for unloading dried workpieces from the drying section to the unloading section.

In addition, the washing section has numerous holding means to hold workpieces and at least one washing mechanism to wash workpieces held by the holding means, said holding means being capable of sequential and intermittent movement between the delivery position at which workpieces are delivered from the first handler to the second handler and the workpiece washing position at which the washing mechanism washes the workpieces.

In the washing apparatus according to this invention, which has the above configuration, since the numerous spin-dry mechanisms alternatively move forward and backward between the workpiece delivery position and the respective drying position, each spin-dry mechanism has a short moving distance, can efficiently move over this short distance in a short time, and requires only a small space for installation and movement, compared to the conventional method of rotating the spin-dry mechanisms mounted on the index table with a large diameter 360° along the vertical circumference. Furthermore, a long moving distance is not required even if the number of spin-dry mechanisms is small. Thus, the moving speed need not be increased, and run-out is is unlikely to occur if the mechanism is moved during spin drying. In addition, since the spin dry mechanism is not rotated 360°, liquid adhering to its cover does not fall onto the other spin-dry mechanisms.

According to one specific aspect of this invention, the drying section has three spin-dry mechanisms wherein first and second spin-dry mechanisms are mounted on a supporting plate that can oscillate over a specified angle around a common axis and move forward and backward between the delivery position and the respective drying position when the supporting plate oscillates, and wherein a third spin-dry mechanism is disposed between the first and second spin-dry mechanisms so that it can move forward and backward between the delivery position and its drying position.

Preferably, the washing apparatus according to this invention can simultaneously process numerous workpieces.

According to another specific aspect of this invention, the first, second, and third handlers are mounted at fixed intervals on a slider that moves forward and backward along a linear rail wherein a single stroke of the slider allows unwashed workpieces to be supplied from the loading section to the washing section, washed workpieces to be transferred from the washing section to the drying section, and dried workpieces to be unloaded from the drying section to the unloading section synchronously by the first, second, and third handlers, respectively.

This configuration enables workpieces to be transferred very efficiently, and also facilitates automatic control.

EMBODIMENT

One preferred embodiment of this invention is described in detail with reference to the drawings.

Figure 1:
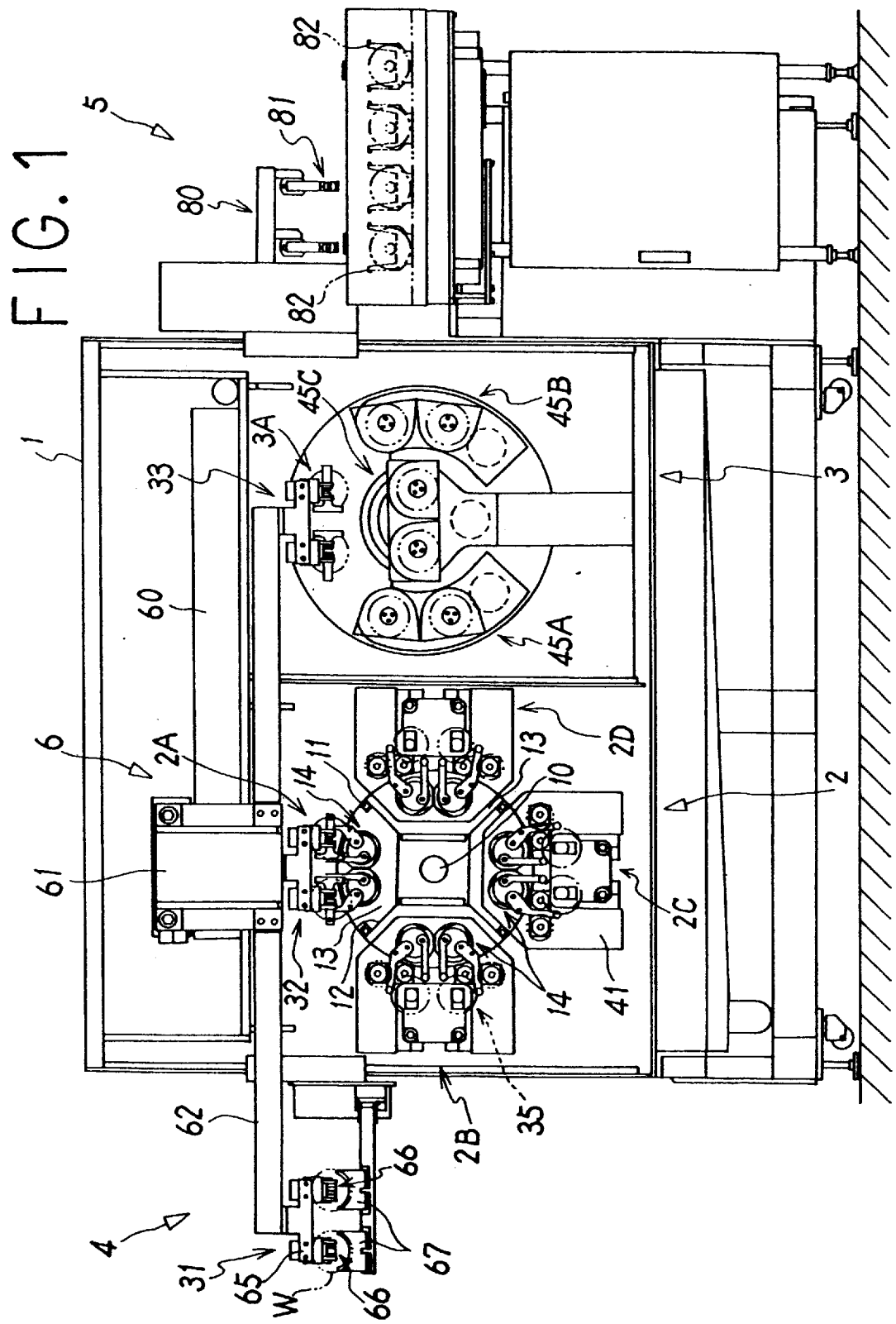
FIG. 1 is a frontal view showing one embodiment of a washing apparatus according to this invention.

In the workpiece washing apparatus shown in FIG. 1, 1 is a body; 2 is a washing section formed inside the body 1 for washing disc-like workpieces W; 3 is a drying section formed adjacent to the washing section 2 for drying washed workpieces W; 4 is a loading section formed on one side of the body 1 for supplying unwashed workpieces W to the washing section 2; 5 is an unloading section formed on the other side of the body 1 for unloading dried workpieces W from the drying section 3; and 6 is a transfer mechanism for transferring workpieces W between sections.

Figure 2:
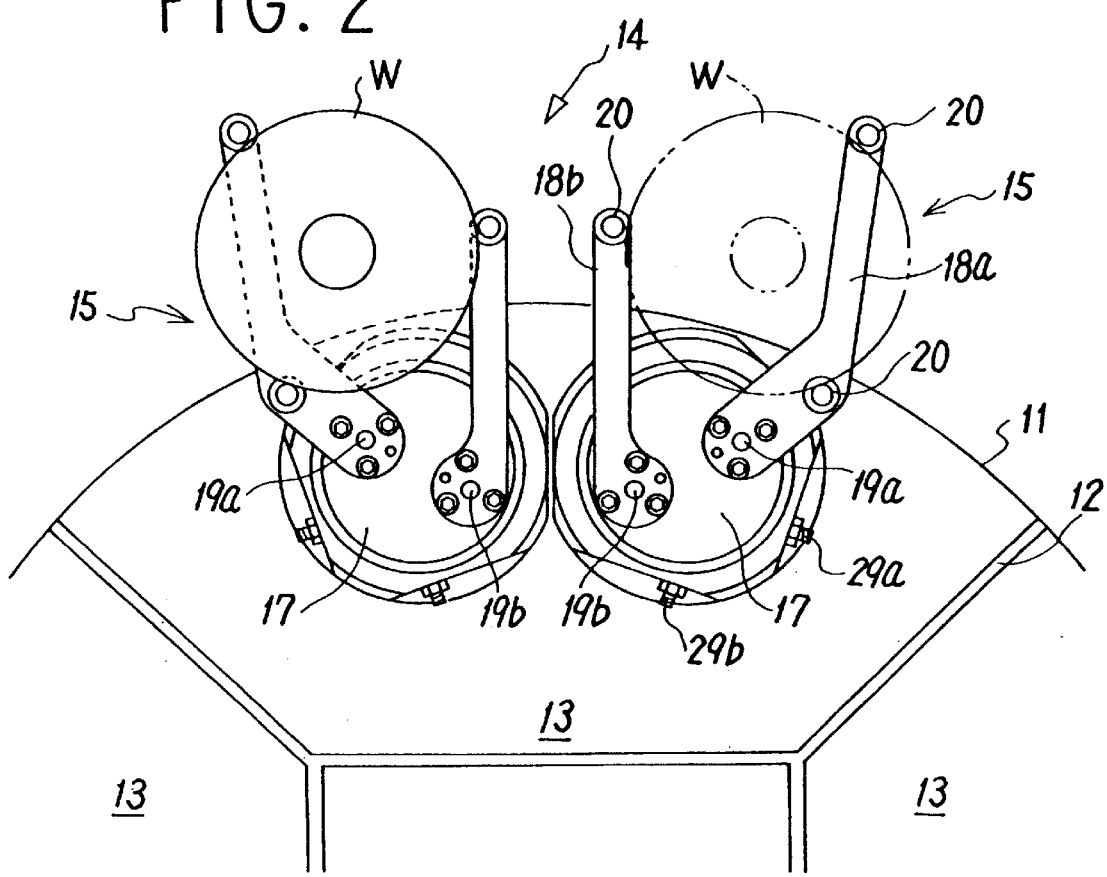
FIG. 2 is an enlarged view of the integral part of a washing section in FIG. 1.

The washing section 2 has a disc-like index table 11 that is intermittently rotated by a motor with gears (not shown) at a fixed angle at a time around a horizontal axis 10. The front surface of the index table is vertically and horizontally partitioned into four regions 13 by a bulkhead 12, and a holding means 14 for holding workpieces W to be washed is installed in each region 13, as shown in FIG. 2. These holding means 14 each have two sets of workpiece chuck means with substantially the same configuration 15, 15, which are horizontally disposed to chuck two workpieces. The chuck means 15 has a generally circular supporting substrate 17 fixed to the index table 11, and a pair of chuck arms 18a, 18b with their proximal ends rotatably supported by the supporting substrate 17 via shafts 19a, 19b, and with their tips extending to the outside of the index table 11.

The first long chuck arm 18a supported by the first shaft 19a has two grooved rollers 20, 20 rotatably attached to its tip and proximal end, while the second short chuck arm 18b supported by the second shaft 19b has one grooved roller 20 rotatably attached to its tip. The rollers 20 of the chuck arms 18a, 18b hold the outer circumference of the workpiece W at three different points. In this case, the center of the held workpiece is located outside the outer circumference of the index table 11.

The roller 20 is formed of hard urethane or some other synthetic resin.

Figure 3:
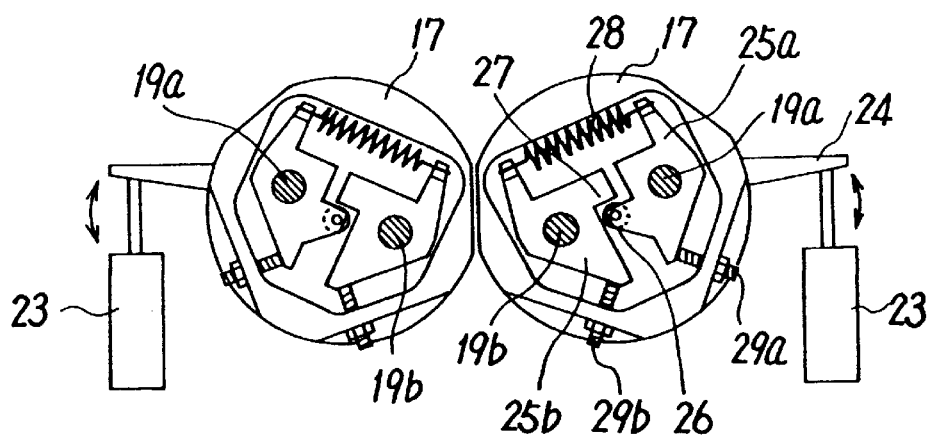
FIG. 3 is a frontal view of the integral part of FIG. 2.

The pair of chuck arms 18a, 18b can be opened and closed with one cylinder and one cam mechanism to deliver workpieces. That is, as seen in FIG. 3, an operation arm 24 that is moved by a cylinder 23 forward and backward over a specified angle behind the index table is fixed to the first shaft 19a, and a first cam member 25a and a second cam member 25b are fixed to the first and the second shafts 19a and 19b, respectively, within the supporting substrate 17. A cam roller 26 is installed in the first cam member 25a, and a cam-receiving section 27 with which the cam roller 26 contacts is available in the second cam member 25b. When the cylinder 23 is contracted to rotate the first shaft 19a clockwise from the position shown in the figure, the first cam member 25a is rotated to cause the cam roller 26 to press the cam-receiving section 27 of the second cam member 25b in order to rotate the second cam member 25b and the second shaft 19b counterclockwise, thereby opening the pair of chuck arms 18a, 18b to enable the workpiece W held by the roller 20 to be unloaded and supplied.

A coil spring 28 extends between the cam members 25a and 25b. When a first handler 31 (see FIG. 1) of the transfer mechanism feeds workpieces W among the rollers 20 and the cylinder 23 returns, the force of the coil spring 28 causes the cam members 25a, 25b and the shafts 19a, 19b to return to the workpiece holding position shown in the figure, thereby closing the pair of chuck arms 18a, 18b and holding the outer circumference of the workpiece W among the three rollers 20.

In the figure, 29a and 29b are stoppers for defining the positions of the cam members 25a, 25b while workpieces are being held, and their positions can be adjusted depending on the diameter of the workpiece being held.

As shown in FIG. 1, a workpiece delivery position 2A at which the transfer mechanism 6 delivers workpieces W to each holding means 14, a first washing position 2B at which a washing mechanism 35 washes workpieces, a second washing position 2C, and a third washing position 2D are sequentially set counterclockwise around the index table 11 from the top of the table. When the index table 11 intermittently rotates counterclockwise 90 at a time, the workpiece holding means 14 in each region 13 sequentially moves between positions 2A to 2D.

The washing mechanism 35 installed at each of the washing positions 2B to 2D has substantially the same configuration, so the washing mechanism 35 installed at the second washing position 2C located at the bottom is described because it is typical.

Figure 4:
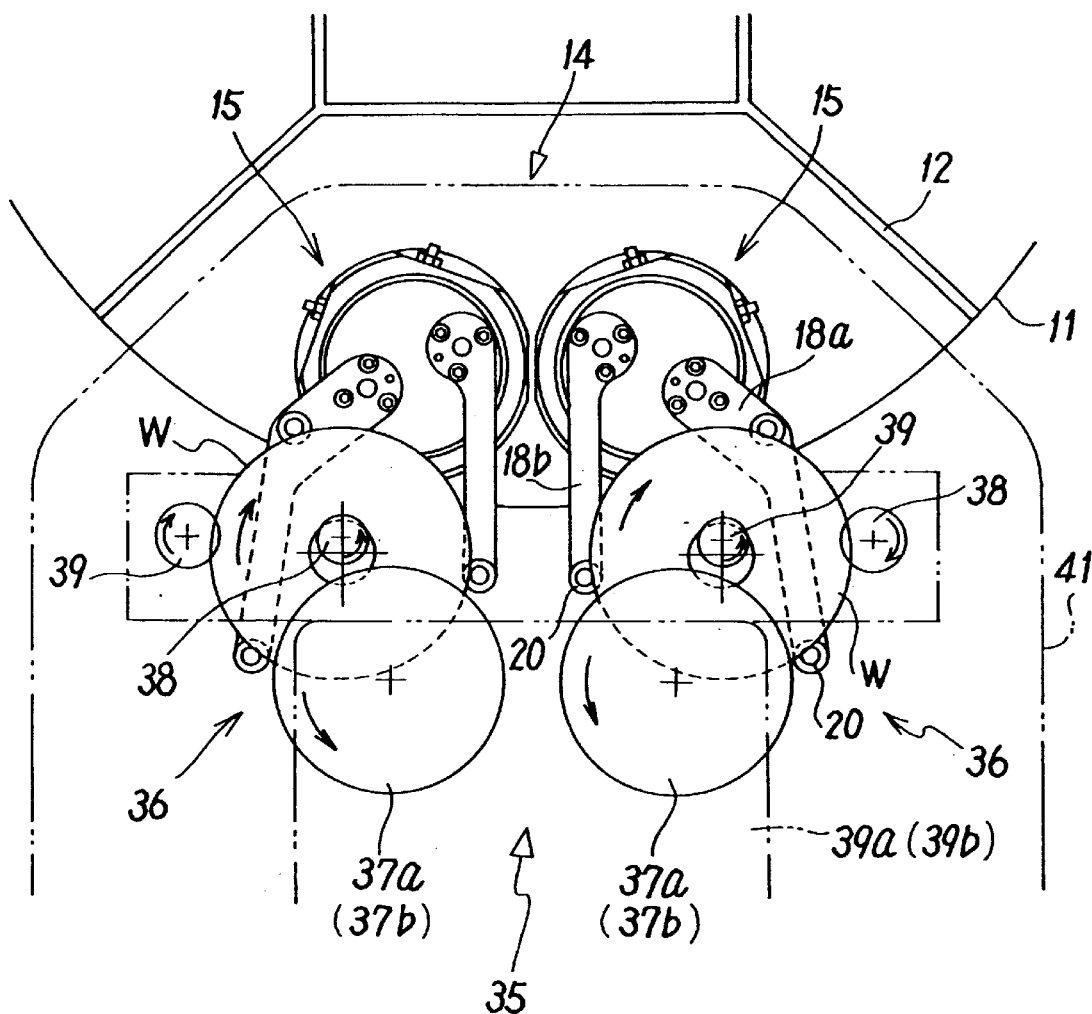
FIG. 4 is an enlarged view of the integral part of the washing section in FIG. 1.
Figure 5:
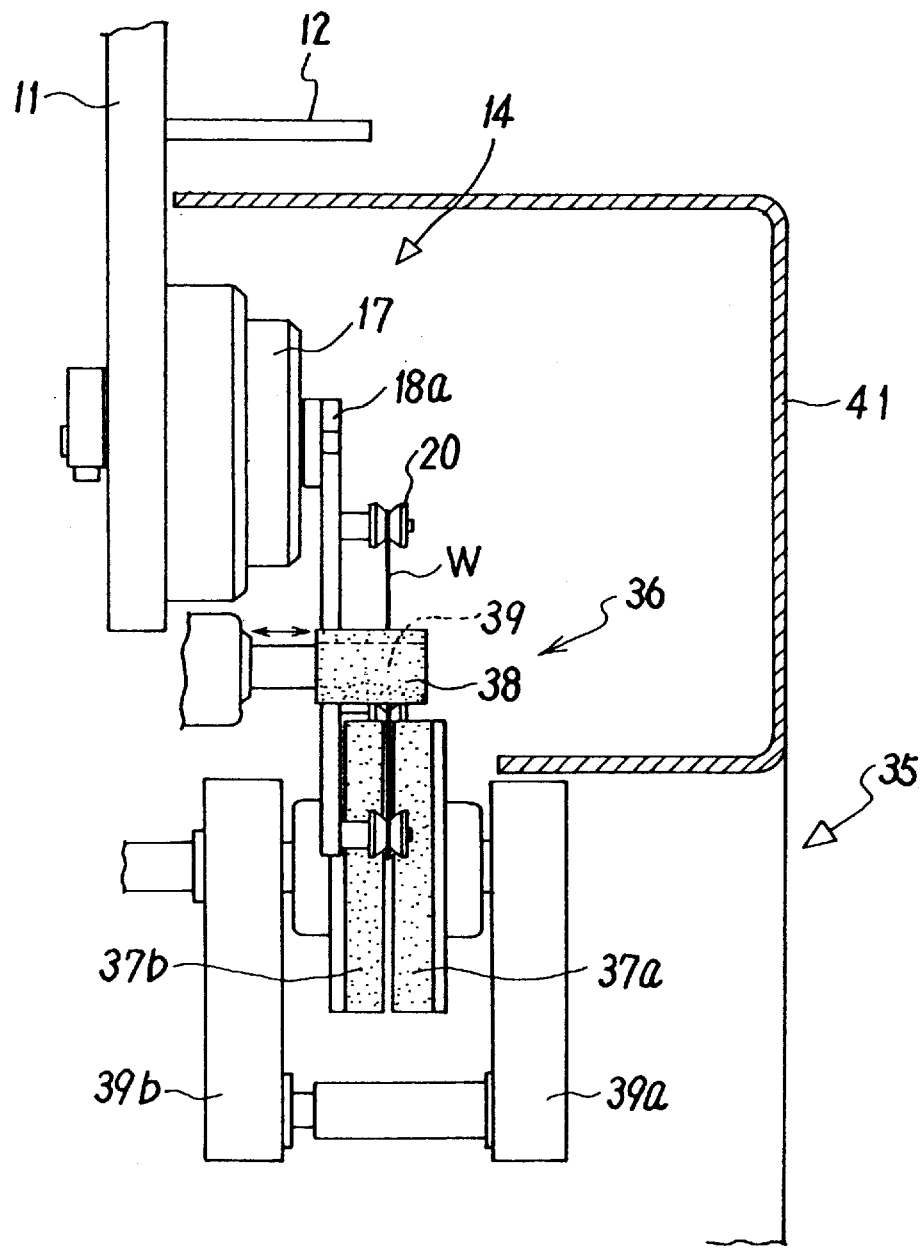
FIG. 5 is a partially exploded side view of FIG. 4.

The washing mechanism 35 has two sets of brushing means 36 with substantially the same configuration to wash two workpieces W held by the holding means 14, as shown in FIGS. 4 and 5. The brushing means 36 have a pair of disk-like face brushes 37a, 37b that grip both front and rear sides of the workpiece W at a position offset from the center toward the outside, one cylindrical outer circumference brush 38 for washing the outer circumference of the workpiece W, and one cylindrical inner circumference brush 39 for washing the inner circumference of the workpiece W. These brushes are formed of a material, such as a synthetic-resin foaming body, that does not damage the workpiece W.

The pair of face brushes 37a, 37b are rotatably attached to holders 39a, 39b supported by the body 1 so that the interval between the holders and the body can be adjusted. When workpieces W are transferred to the washing position, the holders 39a, 39b move to cause the face brushes to contact with both sides of the workpiece, and the brushes rotate in the same direction to wash the workpieces while a washing liquid such as detergent, water, or pure water is supplied by washing liquid supply means (not shown). During indexing, the brushes move to leave the workpieces.

The inner and outer circumference brushes 39 and 38 have their axes disposed in parallel to the axes of the workpieces, and are supported by the body 1 so that they can move axially. When workpieces are transferred to the washing position, the brushes move forward to contact with the inner and outer circumferences of the workpiece, then move forward and backward in the axial direction to wash the workpieces. During indexing, the brushes move backward to leave the workpieces.

The pair of face brushes 37a, 37b and the inner and outer circumference brushes 39 and 38 are driven and rotated by a common motor (not shown) disposed behind the washing section 2.

During washing, the workpieces W follow the rotation of the face brushes 37a, 37b because the face brushes contact with the workpiece at a position closer to the outside.

The washing mechanism 35 also has a cover 41 to prevent washing liquid from splashing. The cover 41 is formed of transparent synthetic resin so as to cover the required parts of the holding means 14 and the brush means 36, and is supported by the body 1 so as to freely contact with and leave the index table 11. During washing, the cover approaches the index table 11 to cover the washed parts, whereas during indexing, it leaves the index table 11 so as not to collide with the bulkhead 12 or the holding means 14.

The cover 41 has at the appropriate position a nozzle for jetting a washing liquid on workpieces W.

In the washing section 2 of the above configuration, when the holding means 14 on the index table 11 receives at the workpiece delivery position unwashed workpieces W from the first handler 31 of the transfer mechanism 6, the index table 11 intermittently rotates 90 at a time to sequentially feed workpieces to the first washing position 2B, the second washing position 2C, and the third washing position 2D, where the workpieces are washed in, for example, detergent, water, and pure water, respectively. The workpieces then return to the workpiece delivery position 2A. At this position, the second handler 32 of the transfer mechanism 6 unloads the workpieces from the holding means 14. After the washed workpieces have been unloaded, more unwashed workpieces are supplied to the holding means 14 by the first handler 31. The above process is then repeated.

Figure 6:
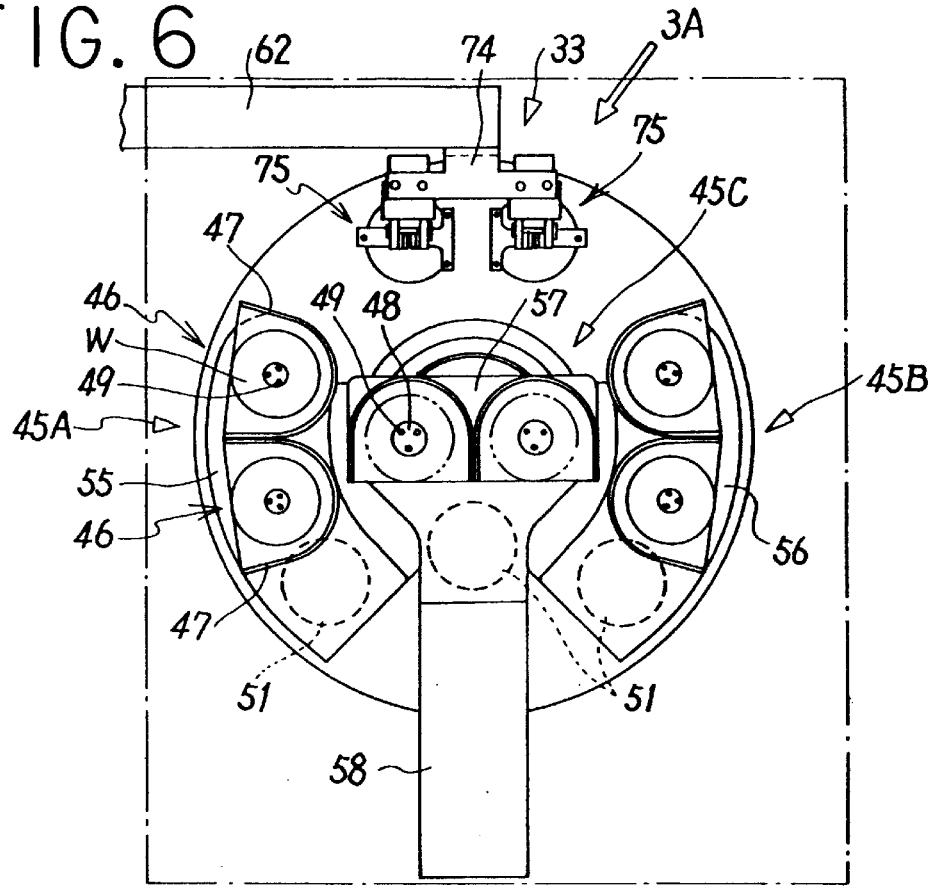
FIG. 6 is an enlarged frontal view of a drying section in FIG. 1.
Figure 7:
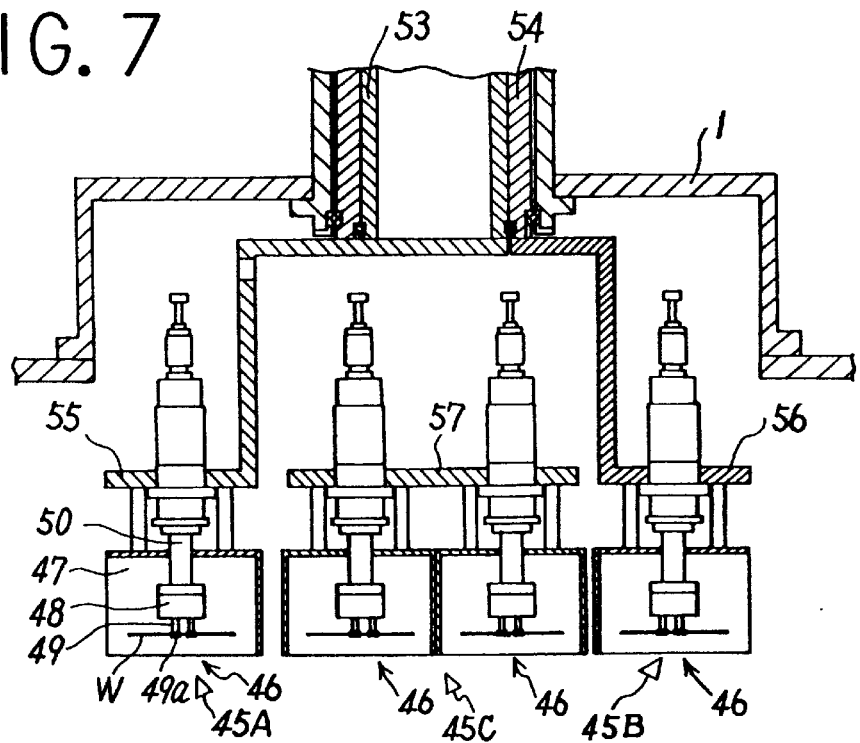
FIG. 7 is a transverse plan view of FIG. 6.

The drying section 3 where workpieces W transferred from the washing section 2 are dried has three spin-dry mechanisms 45A, 45B, and 45C for rotating the workpieces at high speed during drying. The spin-dry mechanism includes two sets of chuck means 46, 46 for chucking the inner circumference of the center hole of the workpiece and a cover 47 that surrounds the workpiece W to prevent water from splashing from the workpiece W, as shown in FIGS. 6 and 7.

The chuck means 46 has three fingers 49 retained by a holder 48 to enable radial adjustment and a spindle 50 for rotating the holder 48. The fingers 49 are gathered together, inserted into the center hole of the workpiece, and moved outward to chuck the inner circumference of the workpiece W using a roller 49a at the tip of each finger. The roller 49a is attached to the finger 49 so that it cannot be rotated.

The spin-dry mechanisms 45A, 45B, and 45C each have a single motor 51 that drives and rotates the spindles 50, 50 of the two sets of chuck means 46, 46.

The first and second spin-dry mechanisms 45A, 45B are disposed at opposite positions close to the lateral ends of the drying section 3, and can oscillate forward and backward along part of the circumference between the respective drying position and the workpiece delivery position 3A set in the upper middle part of the drying section 3. The third spin-dry mechanism 45c is disposed between the first and the second spin-dry mechanisms 45A and 45B, and can vertically move forward and backward in a line between its drying position and the workpiece delivery position 3A.

The points described above are explained in more detail. First and second shafts 53 and 54 that are simultaneously rotated by a drive source (not shown) in both directions at a specified angle are coaxially installed in the middle of the drying section 3, and first and second supporting plates 55, 56 are fixed to the shafts. The first spin-dry mechanism 45A is mounted on the first supporting plate 55 fixed to the first shaft 53 of with a small diameter and extending to the left in the figure, and the second spin-dry mechanism 45B is mounted on the second supporting plate 56 fixed to the second shaft 54 with a large diameter and extending to the right in the figure. When the first shaft 53 rotates clockwise about 90, the first spin-dry mechanism 45A moves to the workpiece delivery position 3A along a circular arc, and when the second shaft 54 rotates counterclockwise about 90, the second spin-dry mechanism 45B moves to the workpiece delivery position 3A along a circular arc.

In this case, two sets of chuck means 46, 46 for the spin-dry mechanisms 45A and 45B are vertically aligned in the drying position, but they are horizontally aligned in the workpiece delivery position 3A, allowing workpieces W to be delivered smoothly.

On the other hand, the third spin-dry mechanism 45C is mounted on the third supporting plate 57 that is attached to the upper end of an elevating arm 58, which can be elevated and lowered by a cylinder, and is moved in a line between its drying position and the workpiece delivery position 3A when the elevating arm 58 is raised and lowered.

In the drying section 3 of the above configuration, the spin-dry mechanisms 45A, 45B and 45C alternatively move to the workpiece delivery position 3A at a specified cycle to receive washed workpieces W from the second handler 32 of the transfer mechanism 6, and return to the respective drying positions to execute spin drying.

Figure 8A:
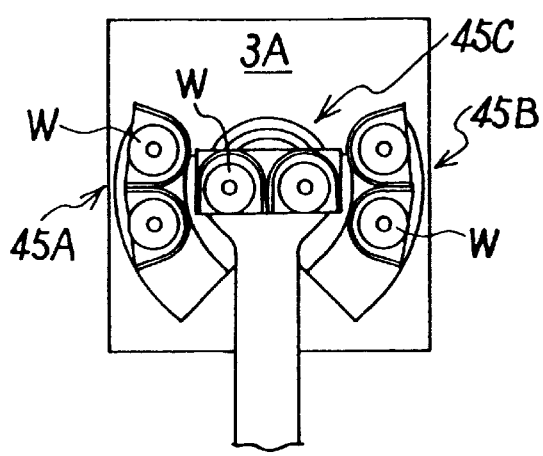
FIGS. 8A to F describe the operations of the drying section.
Figure 8D:
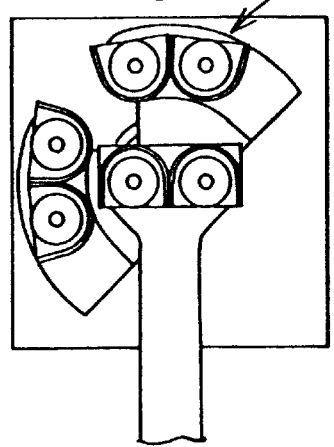
Figure 8B:
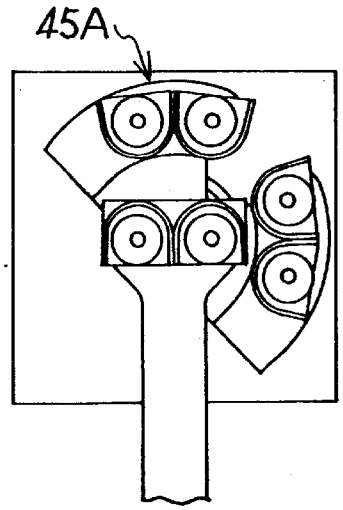
Figure 8E:
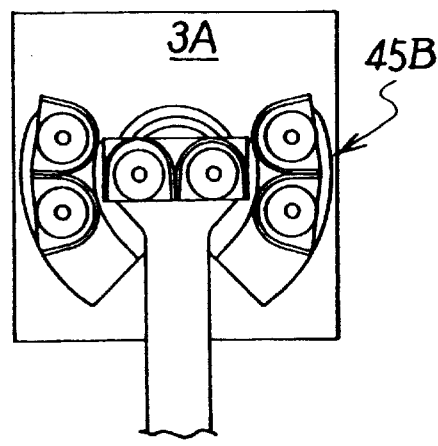
Figure 8C:
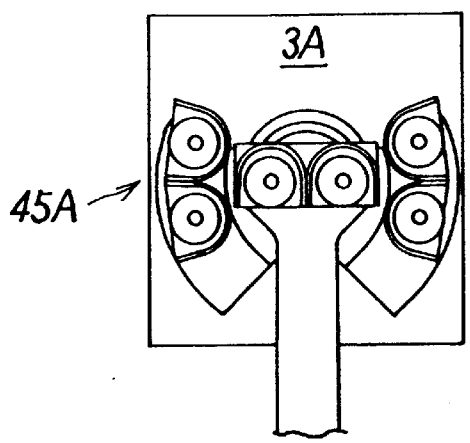

In the state shown in FIG. 8A, when the drying of workpieces W held by the first spin-dry mechanism 45A is completed, the first spin-dry mechanism 45A moves to the workpiece delivery position 3A to deliver dried workpieces to the third handler 33 of the transfer mechanism 6 and receives washed workpieces from the second handler 32, as shown in FIG. 8B, then returns to the drying position to execute spin drying, as shown in FIG. 8C.

Figure 8F:
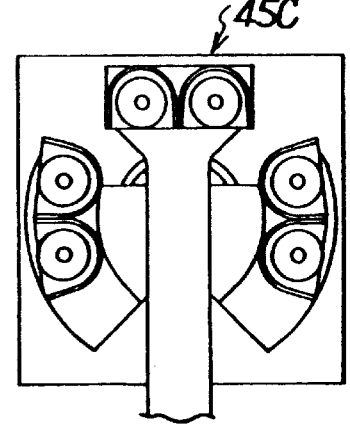

Next, after the second spin-dry mechanism has performed a similar operation, as shown in FIGS. 8D to E, the third spin-dry mechanism 45C performs a similar operation, as shown in FIGS. 8F to A. In this manner, the three spin-dry mechanisms 45A, 45B and 45C sequentially repeat the above process.

The operation cycle of each spin dry mechanism is synchronous with the intermittent rotation cycle of the index table 11 in the washing section 2.

The order of the operation of the spin-dry mechanisms 45A, 45B and 45C is not limited to the above order.

A nozzle is installed in the drying section 3 to supply rinsing liquid to the front and rear surfaces of the workpiece W held by the spin-dry mechanisms 45A, 45B, and 45C so that the workpiece can be dried and rinsed at the same time.

As described above, in the configuration in which numerous spin-dry mechanisms are alternatively moved between the workpiece delivery position and the respective drying position, each spin-dry mechanism has a short moving distance and can efficiently move over this short distance in a short time, compared to the conventional method, in which the spin-dry mechanisms are arranged on the index table and rotated 360° along the vertical circumference. Furthermore, this configuration requires only a small space for installation and movement. In addition, since the mechanism need not be moved over a long distance at high speed, run-out is prevented even if workpieces are rotated at high speed during transfer. Furthermore, since the spin-dry mechanism is not rotated 360° along the vertical circumference, liquid adhering to its cover is prevented from falling onto other spin-dry mechanisms.

The transfer mechanism 6 for transferring workpieces W has one linear rail 60 extending between the washing section 2 and the drying section 3 in the upper part of the body 1; one slider 61 that moves forward and backward along the linear rail 60 over a specified distance; a bar member 62 attached to the slider 61 that permits it to be axially displaced; and first, second, and third handlers 31, 32, and 33, which are attached to both ends and the middle of the bar member 62 as described above.

The first handler 31 attached to the left end of the bar member 62 supplies unwashed workpieces to the washing section 2 from the loading section 4, and two sets of chuck means 66, 66 for chucking the inner circumference of the workpiece using numerous fingers are horizontally mounted on a supporting member 65 fixed to the bar member 62. The chuck means 66, 66 chuck unwashed workpieces W accommodated on two trays 67, 67 in the loading section 4, and the slider 61 moves along the linear rail 60 to transfer the workpieces to the workpiece delivery position 2A of the washing section 2, where the workpieces are supplied to the two chuck means 15, 15 of the holding means 14, standing by therein.

Figure 9:
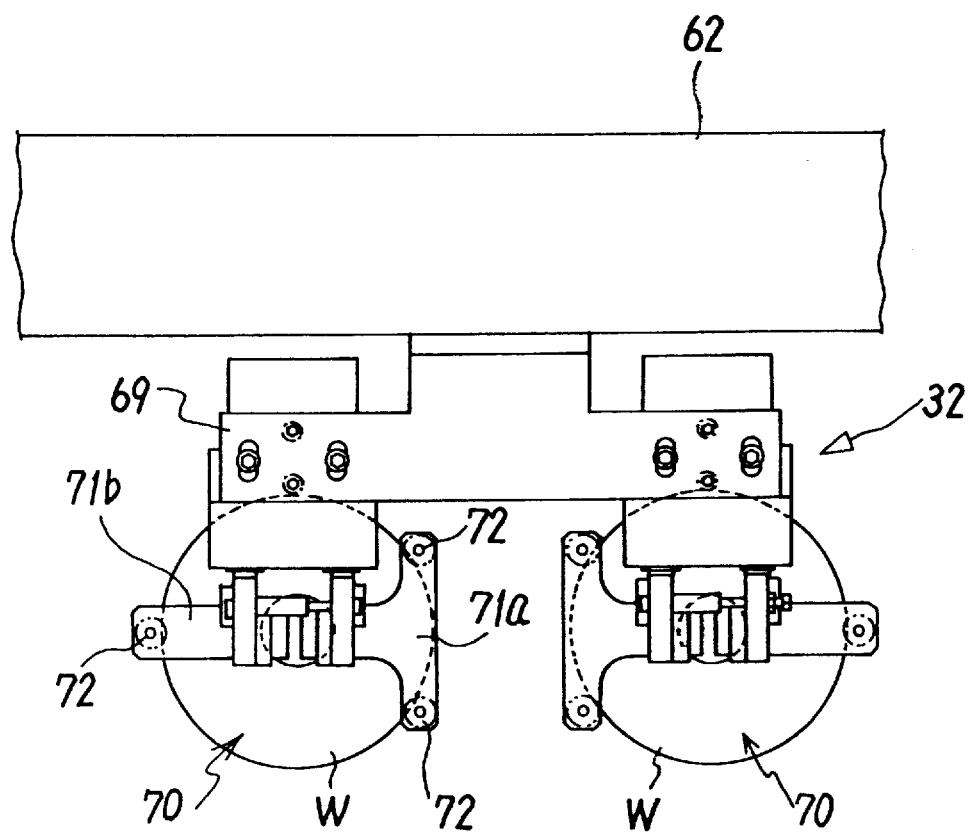
FIG. 9 is an enlarged frontal view of a handler in a transfer mechanism.

The second handler 32 attached to the middle of the bar member 62 transfers washed workpieces from the washing section 2 to the drying section 3, and two sets of chuck means 70, 70 for chucking the outer circumference of the workpieces W using numerous grooved rollers 72 are horizontally mounted on a supporting member 69 fixed to the bar member 62, as shown in FIG. 9. The chuck means 70, 70 receive washed workpieces W from the two chuck means 15, 15 of the holding means 14, which have been standing by at the workpiece delivery position 2A of the washing section 2, and the slider 61 moves along the linear rail 60 to transfer workpieces to the workpiece delivery position 3A of the drying section 3, where the workpieces are supplied to the two chuck means 46, 46 of one of the spin-dry mechanisms 45A, 45B or 45C standing by therein.

The chuck means 70 has a pair of arms 71a, 71b and the intervals between the arms can be adjusted. Two grooved rollers 72, 72 are attached to the arm 71a, while one grooved roller 72 is attached to the arm 71b. These three rollers chuck the outer circumference of the workpiece W. Two rollers may be attached to the supporting member 71b.

The position at which the roller 72 of the second handler 32 chucks the workpiece is different from the position of the washing section 2 at which the roller 20 of the holding means 14 chucks the workpiece, thereby preventing the rollers from competing for the position when workpieces W are delivered.

The third handler 33 attached to the right end of the bar member 62 moves dried workpieces from the drying section 3 to the unloading section 5, and two sets of chuck means 75, 75 for chucking the outer circumference of the workpiece W using numerous of grooved rollers are horizontally mounted on a supporting member 74 fixed to the bar member 62, as shown in FIG. 6. The chuck means 75, 75 receive dried workpieces W from the chuck means 46, 46 of one of the spin-dry mechanisms 45A, 45B, or 45C standing by at the workpiece delivery position 3A of the drying section 3, and the slider 61 moves along the linear rail 60 to transfer the workpieces to the fourth handler 80 in the unloading section 5, where the workpieces are supplied to two chuck means 81, 81 of the fourth handler 80.

The chuck means 81 have substantially the same configuration as the chuck means 70 of the second handler 32 which uses numerous fingers to chuck the inner circumference of the workpiece.

Upon receiving the workpieces W, the fourth handler 80 sequentially accommodates them at specified positions in trays 82 placed in the unloading section 5.

The supply of unwashed workpieces from the loading section 4 to the washing section 2, the transfer of washed workpieces from the washing section 2 to the drying section 3, and the movement of dried workpieces from the drying section 3 to the loading section 4 are simultaneously carried out within a single process of the slider 61 by the first, second, and third handlers 31, 32, and 33, respectively.

Thus, the distance between the loading section 4 and the workpiece delivery position 2A of the washing section 2, the distance between the workpiece delivery position 2A of the washing section 2 and the workpiece delivery position 3A of the drying section 3, and the distance between the workpiece delivery position 3A of the drying section 3 and the loading section 4 are equal to the interval at which the three handlers 31, 32, and 33 are disposed, and to the distance over which the slider 61 moves.

Although the washing mechanism 35 is disposed at three positions of the washings section 2 so that it can deal with three different washing liquids, it may be disposed at one or two positions depending on the washing conditions. In addition, the number of holding members 14 mounted on the index table 11 is not limited to four, and the front surface of the table may be partitioned into three regions with a single holding means mounted in each of these regions.

Likewise, in the above embodiment, three spin-dry mechanisms are installed in the drying section 3, but the number of spin-dry mechanisms may be two depending on conditions.

Furthermore, although the above embodiment has two sets of workpiece chuck means each in the first, second, and third handlers 31, 32, and 33, in the holding means 14, and in the spin-dry mechanisms 45A, 45B, and 45C, and brushing means 36 provided in the washing mechanism 35 to enable two workpieces to be simultaneously processed, the number of the workpiece chuck means and brushing means may be reduced or increased to enable one or three or more workpieces to be processed at a time.

In addition, in the above embodiment, the second handler 32 chucks the outer circumference of washed workpieces W and transfers them to the drying section 3, where the spin-dry mechanisms 45A, 45B, and 45C chuck their inner circumference and spin dry them. In the alternative, the second handler 32 may chuck the inner circumferences of the workpieces W and transfer them to the drying section 3, where the spin-dry mechanisms 45A, 45B, and 45C chuck their inner circumference and spin dry them. In the alternative, the second handler 32 may chuck the inner circumferences of the workpieces W and transfer them to the drying section 3, where the spin-dry mechanisms 45A, 45B, and 45C can chuck their outer circumferences and spin dry them. This prevents droplets from the fingers or the rollers from splashing outwardly along the workpieces, leaving spiral stains on their surfaces, which is likely to occur when the spin-dry mechanisms chuck the inner circumferences of the workpieces.

In this case, in the workpiece chuck means of the spin-dry mechanisms 45A, 45B, and 45C, the numerous rollers for chucking the outer circumferences of the workpieces are connected to the respective driving sources so that they can be driven and rotated at high speed.

As described above, since this invention moves the numerous spin-dry mechanisms of the drying section forward and backward between the workpiece delivery position and the respective drying position, each spin-dry mechanism has a short moving distance, can efficiently move over this short distance in a short time, and requires only a small space for installation and movement, compared to the conventional method, in which the spin-dry mechanisms are mounted on the index table and rotated 360° along the vertical circumference. Thus, since the mechanism need not be moved over a long distance at high speed, run-out is unlikely to occur if the workpieces are rotated at high speed while being transferred. Furthermore, liquid adhering to the cover of the spin-dry mechanism is prevented from falling onto other spin-dry mechanisms.

What is claimed is:

1. A disc-like workpiece washing apparatus consisting of a washing section for washing disc-like workpieces; a drying section for drying washed workpieces; a loading section for supplying unwashed workpieces to said washing section; an unloading section for unloading dried workpieces from said drying section; and a transfer mechanism for transferring workpieces among said sections, in which workpieces to be processed are continuously fed from said loading section so that they can be sequentially washed and dried, then unloaded to said unloading section, wherein:

said drying section has numerous spin-dry mechanisms for drying workpieces at individual drying positions by rotating them at high speed, the mechanisms individually and sequentially moving forward and backward between the respective drying positions and delivery positions at which the workpieces are delivered to said transfer mechanism.

2. A disc-like workpiece washing apparatus consisting of a washing section for washing disc-like workpieces; a drying section for drying washed workpieces; a first handler for supplying unwashed workpieces from said loading section to said washing section; a second handler for transferring washed workpieces from said washing section to said drying section; and a third handler for unloading dried workpieces from said drying section to an unloading section, wherein:

said washing section has numerous holding means for holding workpieces and at least one washing mechanism for washing workpieces held by the holding means, said holding means being capable of sequentially and intermittently moving between a delivery position at which the workpiece is delivered from said first handler to said second handler and a workpiece washing position at which said washing mechanism washes the workpieces, and wherein:

said drying section has numerous spin-dry mechanisms for drying workpieces at individual drying positions by rotating them at high speed, said mechanisms individually and sequentially moving forward and backward between the respective drying position and the delivery position at which the workpiece is delivered to said transfer mechanism.

3. A washing apparatus according to claim 1 or 2 wherein said drying section includes three spin-dry mechanisms, wherein first and second spin-dry mechanisms are mounted on a supporting plate that can oscillate over a specified angle around a common axis and move forward and backward between said delivery position and said drying position when the supporting plate oscillates, and wherein a third spin-dry mechanism is disposed between said first and second spin-dry mechanisms so that it can move forward and backward between the delivery position and its drying position.

4. A washing apparatus according to claim 1 or 2 wherein said apparatus can simultaneously process numerous workpieces.

5. A washing apparatus according to claim 2 wherein said first, second, and third handlers are mounted at fixed intervals on a single slider that moves forward and backward along a linear rail, and wherein a single stroke of said slider allows the unwashed workpieces to be supplied from the loading section to the washing section, the washed workpieces to be transferred from the washing section to the drying section, and the dried workpieces to be moved from the drying section to the unloading section synchronously by the first, second, and third handlers, respectively.

* * * * *